United States Patent
Neuhaeuser

(10) Patent No.: US 7,049,510 B2
(45) Date of Patent: May 23, 2006

(54) SENSOR

(75) Inventor: Torsten Neuhaeuser, Bahlingen (DE)

(73) Assignee: Sick AG, Waldkirch/Breisgau (DE)

( * ) Notice: Subject to any disclaimer, the term of this patent is extended or adjusted under 35 U.S.C. 154(b) by 429 days.

(21) Appl. No.: 10/138,729

(22) Filed: May 3, 2002

(65) Prior Publication Data

US 2003/0002241 A1 Jan. 2, 2003

(30) Foreign Application Priority Data

May 4, 2001 (DE) .......................... 101 21 776

(51) Int. Cl.
*H02G 3/08* (2006.01)

(52) U.S. Cl. .................. 174/52.1; 174/52.4; 174/36; 174/524; 174/261; 174/260; 174/117 F; 361/707; 361/736; 361/704; 361/760; 361/694; 361/641; 361/818; 324/207.26; 335/207; 335/206; 335/205

(58) Field of Classification Search ............. 174/52.1, 174/52.4, 36, 524, 261, 260, 117 F; 361/707, 361/736, 704, 760, 694, 641, 818; 324/207.26; 335/207, 206, 205

See application file for complete search history.

(56) References Cited

U.S. PATENT DOCUMENTS

| | | | | |
|---|---|---|---|---|
| 4,424,404 A | * | 1/1984 | Moore et al. | 174/52.1 |
| 5,201,128 A | * | 4/1993 | Olivier et al. | 33/355 R |
| 5,319,522 A | * | 6/1994 | Mehta | 361/748 |
| 5,554,964 A | * | 9/1996 | Jansseune | 335/207 |

* cited by examiner

*Primary Examiner*—Anthony Dinkins
*Assistant Examiner*—Anton Harris
(74) *Attorney, Agent, or Firm*—Townsend and Townsend and Crew LLP

(57) ABSTRACT

A sensor with a carrier board which is arranged in a housing is at least partly produced by an injection molding process and fitted with electronic, optical, electromechanical and/or opto-electronic components. A region of the carrier board and at least some of the components disposed thereon are arranged in a hollow space formed inside the at least partly injection molded housing.

15 Claims, 3 Drawing Sheets

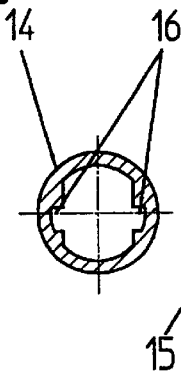
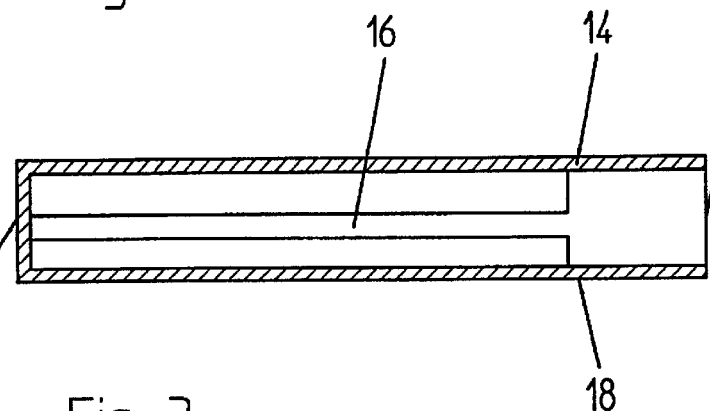
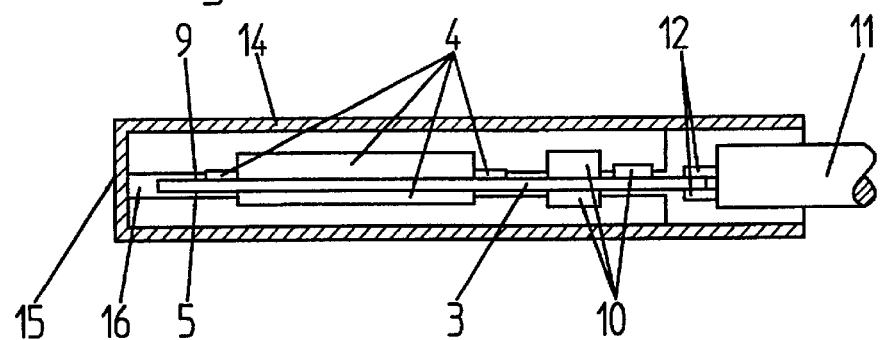
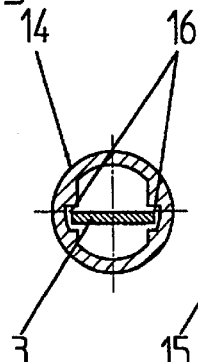
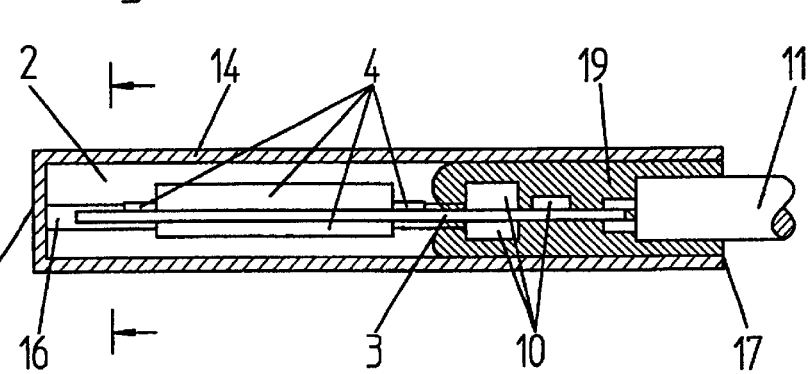

SENSOR

BACKGROUND OF THE INVENTION

The invention relates to a sensor comprising a carrier board which is arranged in a housing manufactured at least partly in an injection molding process and is fitted with electronic, optical, electromechanical and/or opto-electronic components.

Sensors of this kind are used, for example as magnetic sensors, inductive sensors or opto-electronic sensors, in the most varied manner. In this connection, it is in particular desirable to also be able to use the sensors under extreme conditions, for example with high or very varying temperatures or at moving parts at which the sensors are exposed to high accelerations.

The fact is disadvantageous with the known sensors that the temperature strains or acceleration strains frequently result in damage to sensor components or to the whole sensor, which can ultimately result in a malfunction or a standstill of machinery and plant in which the sensor is used.

SUMMARY OF THE INVENTION

An object of the invention consists of further developing a sensor of the kind initially named so that its resistance capability to temperature changes and in particular also to acceleration forces, and thus also its service life, is increased.

This object is satisfied in accordance with the invention in that a region of the carrier board and at least some of the components disposed thereon are arranged in a hollow space formed within the housing which is at least partly injection molded.

The possibility exists due to the arrangement in accordance with the invention of a region of the carrier board inside a hollow space that temperature-induced size changes in that region of the carrier board, in particular an expansion of the region, cannot result in damage to the carrier board, since there is sufficient room present in the hollow space in accordance with the invention for such expansions. Accordingly, these temperature-induced size changes can also not result in damage to the components arranged on this region of the carrier board.

Furthermore, that region of the carrier board has so much room available in the hollow space that it can execute vibrations triggered by accelerations of the sensor. For this purpose, the carrier board must have a certain elasticity, with the elasticity of commercial boards being sufficient. Due to the possibility of the execution of vibrations, accelerations of the sensor are not directly transmitted to the components arranged on that region of the carrier board; it is rather achieved that these accelerations are "cushioned".

Accordingly, a sensor in accordance with the invention has an increased resistance to temperature changes, in particular to a large lowering of the temperature and to accelerations.

It is preferred for the components arranged in the hollow space to be arranged spaced from the boundary of the hollow space. It is ensured in this manner that acceleration forces cannot be transmitted directly from the boundary of the hollow space to the components; a vibration of the carrier board is rather made possible which cushions the accelerations and only transmits them to the components in a reduced manner.

It is of advantage if the lower side and the upper side of the region of the carrier board arranged in the hollow space are arranged spaced from the boundary of the hollow space. It is achieved in this manner that the carrier board can execute vibrations both downwardly and upwardly. An acceleration acting on the sensor can thus set the carrier board into a harmonious, slowly decaying vibration which results in an optimized reduction in the acceleration forces acting on the components.

It is particularly advantageous for the end faces of the region of the carrier board arranged in the hollow space to be arranged spaced from the boundary of the hollow space. In this manner, the region can expand in all directions due to temperature increases and/or it becomes possible for the housing to contract without the carrier board and the boundary of the hollow space abutting one another. A shearing off of components surrounded by injection molded material, which is possible in accordance with the prior art, is likewise avoided since, in accordance with the invention, the components are not surrounded by injection molded material, but are arranged in the hollow space. Temperature-induced forces on the carrier board and/or on the components, and damage linked thereto, are therefore generally avoided.

The carrier board can be fixed, for example, only to one side of the hollow space in the material surrounding the hollow space so that the carrier board projects into the hollow space like a spring board. An optimum expansion and vibration possibility of the carrier board is thus achieved. In this connection, it is particularly preferred for the region of the carrier board arranged outside the hollow space to be at least regionally surrounded by injection molded housing material to fix the carrier board in the hollow space.

At least one movement limiting element can project into the hollow space with its end region facing the carrier board being arranged spaced from the carrier board. Such a movement limiting element can serve to limit the bendings of the carrier board brought about by vibrations thereof so that the bendings of the carrier board always move in its elasticity region and thus a breaking off of the carrier board is prevented. In this connection, the spacing between the end region of the movement limiting element and the carrier board must be optimized so that vibrations with an amplitude which is large as possible are allowed, on the one hand, in order to thus achieve a maximum cushioning of accelerations acting on the components, and so that the oscillations are limited, on the other hand, so that their amplitude cannot become so large that a breaking off of the carrier board occurs.

The movement limiting element is sensibly arranged at that side of the hollow space remote from the region in which the carrier board is fixed in the material surrounding the hollow space. It is thus ensured that the movement limiting element is disposed where the largest vibration amplitudes of the carrier board occur.

It is of advantage if two movement limiting elements are provided of which one is directed toward the upper side and the other toward the lower side of the carrier board. The vibration amplitudes of the carrier board can thus be directly limited in both directions. The movement limiting element(s) can be formed, for example, by the housing material and be jointly produced with the injection molding procedure for the housing.

Additional components disposed outside the hollow space and surrounded by injection molded housing material can be arranged on the carrier board. In particular such components are suitable for this which are less sensitive to accelerations so that here the protection against accelerations which is required by the measures in accordance with the invention can be dispensed with.

The hollow space in accordance with the invention can be formed by a sleeve, in particular a beaker-shaped sleeve, which completely receives the carrier board and in which housing material is only injected regionally so that the region of the carrier board arranged in the hollow space is disposed outside the housing material and the region of the carrier board arranged outside the hollow space is surrounded by injection molded housing material.

Alternatively, the hollow space in accordance with the invention can also be formed by means of an internal gas pressure method known from the prior art. In this case, the sleeve described above can be dispensed with. Moreover, in this case, the whole housing can be produced in the course of a single injection molding process. A complex casting required in other manufacturing processes is thus omitted.

The invention will be described in the following with reference to embodiments and to the drawings.

BRIEF DESCRIPTION OF THE DRAWINGS

FIGS. 2a, b are a cross-section and a longitudinal section through a sleeve which can be used in a first embodiment of the invention;

FIG. 3 is a view in accordance with FIG. 2b with a carrier board inserted in the sleeve;

FIGS. 4a, b are a cross-section and a longitudinal section through a sleeve in accordance with FIG. 3 with housing material injected in.

DESCRIPTION OF THE PREFERRED EMBODIMENTS

Figure 1:
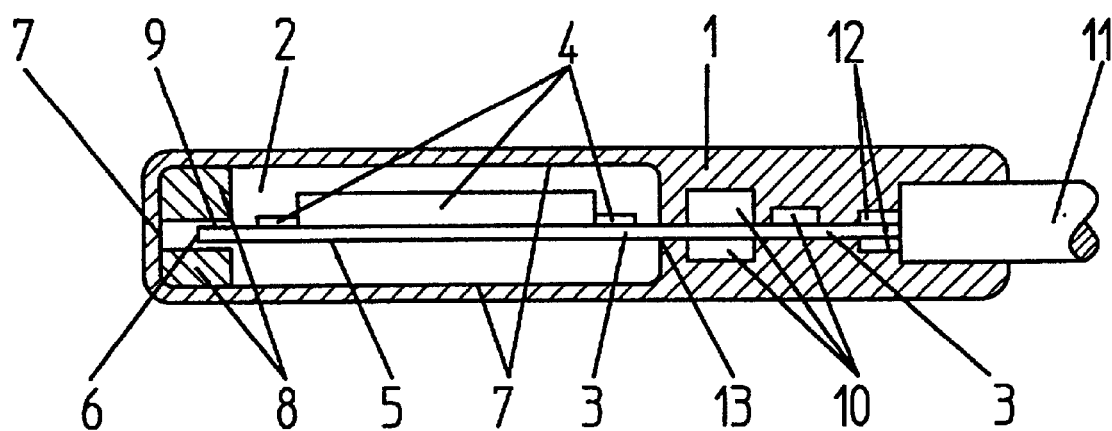
FIG. 1 is a sectional view through a sensor made in accordance with the invention.

FIG. 1 shows a sensor housing 1 substantially rectangular in cross-section with rounded edges, with a hollow space 2 being formed in the sensor housing 1, the hollow space being completely surrounded by housing material, having a likewise substantially rectangular shape in cross-section and extending, seen in the longitudinal direction of the sensor housing 1, over a region thereof.

A carrier board 3 is arranged in the sensor housing 1, with a region of the carrier board 3 being disposed inside the hollow space 2 and the remaining region of the carrier board 3 being disposed outside the hollow space 2. In this connection, the region of the carrier board 3 disposed outside the hollow space 2 is surrounded by housing material.

Shock-sensitive electronic and electromechanical components 4 are arranged on the region of the carrier board 3 disposed in the hollow space 2. The components 4, like the lower side 5 of the carrier board 3 and the end face 6 of the carrier board 3, have a spacing to the boundary 7 of the hollow space.

The carrier board 3 with the components 4 is thus fixed in place at its region disposed outside the hollow space 2 by the housing material of the sensor housing 1 and accordingly projects like a spring board into the hollow space 2.

At the side of the hollow space 2 remote from the fixing of the carrier board 3, two movement limiting elements 8 are provided which project into the hollow space 2 and are directed toward the upper side 9 or the lower side 5 of the carrier board 3. In this connection, the movement limiting elements terminate at a low spacing from the upper side 9 or from the lower side 5.

Furthermore, additional, shock-insensitive components 10 are arranged on the upper side 9 of the carrier board 3 and are located, however, outside the hollow space 2 and are surrounded by housing material of the sensor housing 1.

A cable insulation 11 is embedded in the housing material of the sensor housing 1 and wires 12 are guided from this inside the sensor housing 1 to the carrier board 3 made, for example, as a circuit board. A power supply or an exchange of data can take place via the wires 12.

The following is achieved by the arrangement in accordance with the invention illustrated in FIG. 1:

Since the carrier board 3 is only surrounded by housing material and is thus fixed in place at its region disposed to the right of the hollow space 2 in FIG. 1 and as the remaining region of the carrier board 3 projects like a spring board into the hollow space 2, it is ensured that the region of the carrier board 3 disposed in the hollow space 2 can expand or contract as a result of temperature changes, without the carrier board 3, or the components 4 arranged thereon, abutting the boundary 7 of the hollow space. Damage to the carrier board 3 and to the components 4 by temperature effects are thus effectively avoided.

It is furthermore ensured that the carrier board 3 can vibrate about an axis substantially disposed at the position 13 in accordance with FIG. 1 and extending perpendicular to the plane of the drawing when accelerations of the sensor housing 1 occur, with the amplitude of this vibration being limited by the two movement limiting elements 8. Only damped or cushioned acceleration forces are transmitted to the components 4 due to this vibration possibility so that shock-sensitive components 4 can be used in a sensor in accordance with the invention. It is ensured by limiting the vibration amplitude with the movement limiting elements 8 that the components 4 cannot release from the carrier board 3 due to the vibrations and the deflections associated therewith and that the solder points of the components 4 are not damaged.

FIGS. 2 to 8 explained in the following show two different possibilities for manufacturing a sensor in accordance with the invention, with all advantages which were explained above in connection with FIG. 1 being realized with both variants.

FIGS. 2a and 2b show a cross-section (FIG. 2a) and a longitudinal section (FIG. 2b) through a sleeve 14 which can be used in accordance with the invention and which has a cylindrical shape at its outer side and is closed at an end face 15 so that the sleeve 14 ultimately represents a beaker-shaped formation. Two diametrically opposed elongate grooves 16 are worked in at the inner side of the sleeve and extend from the end face 15 up to and into a region 18 of the sleeve 14 spaced from the oppositely disposed end face 17.

FIG. 3 shows a representation in accordance with FIG. 2b, with a carrier board 3 being inserted so far into the elongate grooves 16 that its end confronting the end face 15 of the sleeve 14 comes to lie at a spacing from this end face 15. Components 4 and components 10 are arranged at the upper side 9 and at the lower side 5 of the carrier board 3, with the components 10 all being disposed at a greater spacing from the end face 15 than the components 4. The components 4 are shock-sensitive components, whereas the components 10 are shock-insensitive.

If optical components are also used, it is sensible to provide the sleeve 14 with a window through which radiation can pass.

Wires 12 which merge into a cable insulation 11 are connected to the carrier board 3. The end of the cable insulation 11 facing the carrier board 3 ends inside the sleeve 14.

The thickness of the carrier board 3 is dimensioned so that it can still be moved upwardly and downwardly inside the elongate grooves 16 over a low path distance. In FIG. 3, a position of the carrier board 3 is shown in which it is disposed centrally in the elongate grooves 16 so that it could theoretically be movable both upwardly and downwardly. The injection method described in the following in connection with FIG. 4 takes place while the carrier board 3 is fixed in the position shown in FIG. 3 by means of a suitable holding tool.

In accordance with FIG. 4b, housing material 19 is injected into the sleeve 14 from the end face 17, with the carrier board 3 fixed in this manner. The housing material 19 and the sleeve 14 preferably consist of the same material since this results in a good connection and/or sealing between the housing material 19 and the sleeve 14. The injection molding process is continued until the housing material 19 surrounds the cable insulation 11, the wires 12 and all components 10. The injection molding process is ended directly thereafter so that the housing material 19 does not reach up to the components 4.

It is achieved in this manner that the carrier board 3 projects from the housing material 19 like a spring board in the direction of the end face 15 so that the components 4 ultimately come to lie in a hollow space 2 formed inside the sleeve 14.

The carrier board 3 is upwardly and downwardly movable in the elongate groove 16 (see FIG. 4a) in this hollow space 2 so that it can execute the vibrations explained above. The amplitude of these vibrations is, however, limited by the elongate groove 16. To this extent, the function of the elongate grooves 16 corresponds in the completed state of the sensor to the function of the movement limiting elements 8 in accordance with FIG. 1.

What is important is that the dimensions of the carrier board 3 are dimensioned perpendicular to the plane of the drawing so that the carrier board 3 would be movable—where it is not fixed in place by the housing material 19—perpendicular to the plane of the drawing in all directions, i.e. in the direction of the end face 15 (FIG. 4b) and in the directions (FIG. 4a) perpendicular thereto, since it does not abut the sleeve 14 in these directions. This has the effect that the carrier board 3 can expand perpendicular to the plane of the drawing or that the sleeve 14 can contract in the event of temperature increases.

Figure 5:
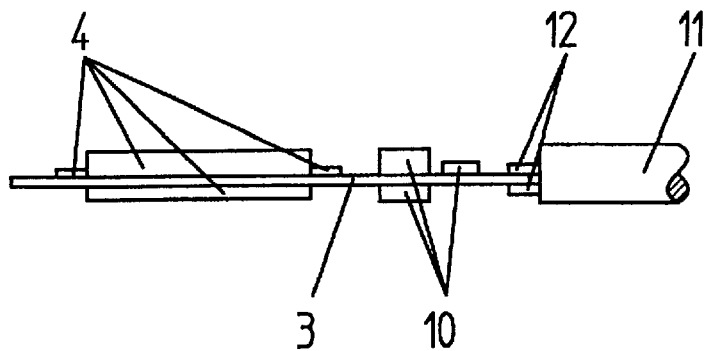
FIGS. 5 to 8 illustrate four method steps for the manufacture of a second embodiment of a sensor in accordance with the invention by means of an internal gas pressure method.

FIG. 5 shows a carrier board 3 with shock-sensitive components 4 and shock-insensitive components 10 arranged thereon. Two wires 12 are connected to the carrier board 3 and open into a cable insulation 11. The arrangement of the parts 3, 4, 10, 11 and 12 corresponds to those of FIGS. 3 and 4.

The arrangement shown in FIG. 5 is now introduced into an injection mold—not shown—whose inner dimensions correspond at least substantially to the outer contour of the sensor housing ultimately to be achieved. Injection of housing material 19 into the injection mold is subsequently started, with this injection procedure taking place at the same side of the sensor as described in connection with FIG. 4.

Figure 6:
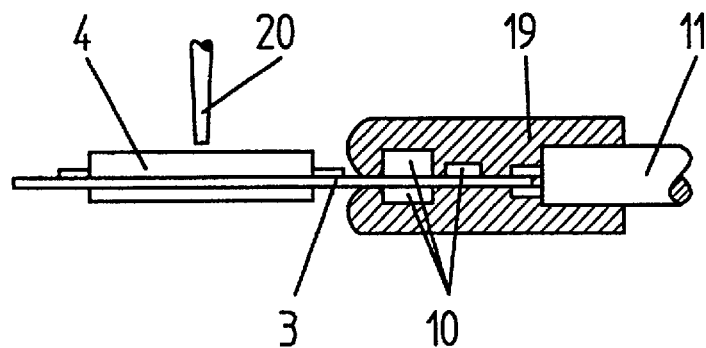

In the method step of the injection molding process shown in FIG. 6, the shock-insensitive components 10, the corresponding region of the carrier board 3, the wires 12 and the cable insulation 11 are surrounded by housing material 19.

It can furthermore be seen in FIG. 6 that a gas injection nozzle 20 is arranged in the region of the shock-sensitive components 4 and allows the carrying out of an internal gas pressure injection molding known from the prior art.

Figure 7:
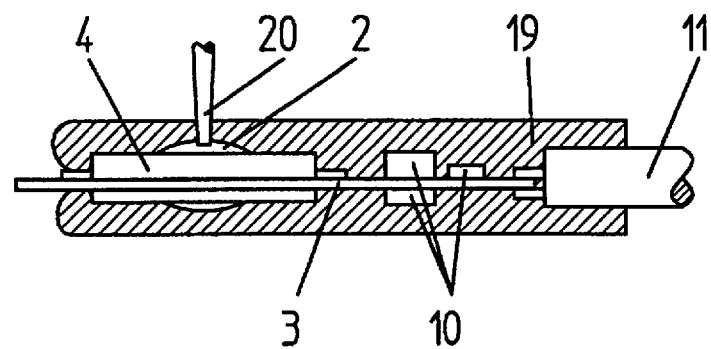

In the course of the further injection procedure shown in FIG. 7, the housing material penetrates up to and into a region of the shock-sensitive components 4, with gas simultaneously being brought into the region of the shock-sensitive components 4 via the gas injection nozzle 20. The introduction of this gas through the gas injection nozzle 20 has the effect that a hollow space 2 starts forming in the region of the shock-sensitive components 4.

By continuing the described method, the injection mold—not shown—is ultimately completely filled with housing material 19 (see FIG. 8), with the hollow space 2 simultaneously being enlarged by the continued introduction of gas so that all components 4 are disposed inside the hollow space 2, with a spacing always being present between the boundary 7 of the hollow space and the components 4 or the carrier board 3 so that no direct contact is produced between the carrier board 3 and the housing material 19 (see FIG. 8 again).

Just before the end of the injection procedure, the gas injection nozzle 20 is retracted from the region of the sensor housing to be formed so that the hollow space 2 or the nozzle aperture can be completely closed by the termination of the injection procedure. Alternatively, the nozzle aperture can also be subsequently closed by means of a plug.

Figure 8:
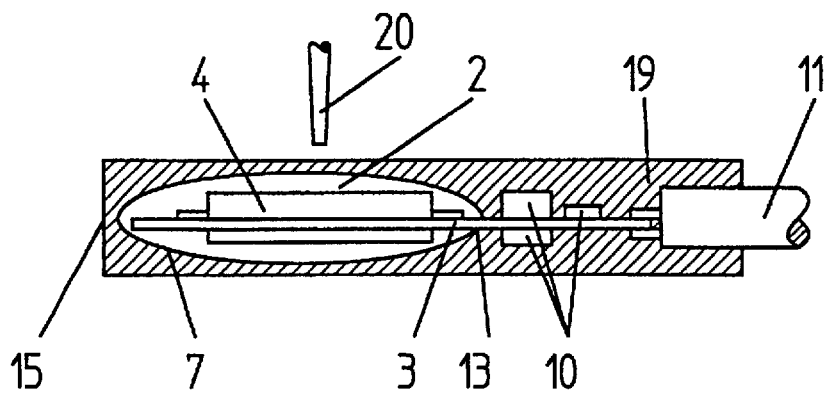

As FIG. 8 shows, it is also achieved by the latter method that the carrier board projects like a spring board into the hollow space 2 with the shock-sensitive components 4 and is spaced apart from the boundary 7 of the hollow space. The dimension of the hollow space 2 tapering toward the end face 15 of the sensor has the same function in this case as the movement limiting elements 8 in accordance with FIG. 1.

What is claimed is:

1. A sensor with a carrier board which is arranged in a housing produced at least partly in an injection molding process and which is fitted with electronic, optical, electro-mechanical and/or opto-electronic components, characterized in that a region of the carrier board and at least some of the components disposed thereon are arranged in a hollow space formed inside the at least partly injection molded housing, and in that the carrier board is only fixed in the material surrounding the hollow space at one side of the hollow space such that the carrier board projects into the hollow space like a spring board.

2. A sensor in accordance with claim 1, characterized in that the components arranged in the hollow space are spaced apart from the boundary of the hollow space.

3. A sensor in accordance with claim 1, characterized in that the lower side and the upper side of the region of the carrier board arranged in the hollow space are arranged spaced apart from the boundary of the hollow space.

4. A sensor in accordance with claim 1, characterized in that the end faces of the region of the carrier board arranged in the hollow space are arranged spaced apart from the boundary of the hollow space.

5. A sensor in accordance with claim 1, characterized in that the region of the carrier board arranged outside the hollow space is surrounded at least regionally by injection molded housing material to fix the carrier board in the hollow space.

6. A sensor in accordance with claim 1, characterized in that at least one movement limiting element projects into the hollow space and its end region confronting the carrier board is arranged spaced apart from the carrier board.

7. A sensor in accordance with claim 6, characterized in that the movement limiting element is arranged at that side of the hollow space which is remote from the region in which the carrier board is fixed in the material surrounding the hollow space.

8. A sensor in accordance with claim 6, characterized in that two movement limiting elements are provided, of which one is directed toward the upper side of the carrier board and the other is directed toward the lower side of the carrier board.

9. A sensor in accordance with claim 1, characterized in that additional components surrounded by injection molded housing material and disposed outside the hollow space are arranged on the carrier board.

10. A sensor in accordance with claim 1, characterized in that the hollow space is formed by a sleeve, in particular a beaker-shaped sleeve, which fully receives the carrier board and into which housing material is injected only regionally such that the region of the carrier board arranged in the hollow space is disposed outside the housing material and the region of the carrier board arranged outside the hollow space is surrounded by injection molded housing material.

11. A sensor in accordance with claim 1, characterized in that the hollow space is formed by means of an internal gas pressure process.

12. A sensor in accordance with claim 10, characterized in that the hollow space is formed by means of an internal gas pressure process.

13. A sensor comprising a carrier board having first and second board portions and an edge defining a periphery of the carrier board, a component mounted on the first board portion, and a housing defining an interior hollow space surrounded by material of the housing, the second portion of the carrier board extending into and being fixedly secured to the material of the housing and the first portion projecting from the material of the housing into the interior hollow space, a part of the edge defined by the first portion of the carrier board being spaced from the housing material so that the first portion of the carrier board is movable relative to the surrounding material of the housing.

14. A sensor according to claim 13, wherein the housing is at least in part produced by an injection molding process.

15. A sensor according to claim 13, wherein the component comprises at least one of an electronic component, an optical component, an electromechanical component, and an opto-electronic component.

* * * * *